United States Patent
Dhane et al.

(10) Patent No.: US 11,581,240 B2
(45) Date of Patent: Feb. 14, 2023

(54) LIQUID THERMAL INTERFACE MATERIAL IN ELECTRONIC PACKAGING

(71) Applicant: INTEL CORPORATION, Santa Clara, CA (US)

(72) Inventors: Kedar Dhane, Chandler, AZ (US); Omkar Karhade, Chandler, AZ (US); Aravindha R. Antoniswamy, Phoenix, AZ (US); Divya Mani, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 884 days.

(21) Appl. No.: 16/230,021

(22) Filed: Dec. 21, 2018

(65) Prior Publication Data

US 2020/0203254 A1    Jun. 25, 2020

(51) Int. Cl.
*H01L 23/34*  (2006.01)
*H01L 23/42*  (2006.01)
*H01L 23/31*  (2006.01)
*H01L 23/00*  (2006.01)

(52) U.S. Cl.
CPC .......... *H01L 23/42* (2013.01); *H01L 23/3114* (2013.01); *H01L 24/17* (2013.01); *H01L 2924/14* (2013.01)

(58) Field of Classification Search
CPC . H01L 23/42; H01L 23/46; H01L 2023/4037; H01L 2023/405
USPC ......................................... 257/713, 706, 714
See application file for complete search history.

(56) References Cited

U.S. PATENT DOCUMENTS

| | | | |
|---|---|---|---|
| 6,084,297 A * | 7/2000 | Brooks | H01L 23/49816 257/E23.114 |
| 8,021,921 B2 * | 9/2011 | Lin | H01L 24/12 257/772 |
| 8,987,891 B2 * | 3/2015 | Di Stefano | F28F 3/022 257/714 |
| 9,462,673 B2 * | 10/2016 | Zhang | H05K 1/0203 |
| 9,502,342 B2 * | 11/2016 | Kim | H01L 21/565 |
| 10,163,754 B2 * | 12/2018 | Ho | H01L 23/433 |
| 2003/0183909 A1 * | 10/2003 | Chiu | H01L 23/04 257/E23.101 |
| 2005/0226779 A1 * | 10/2005 | Oldham | B01L 3/50851 422/400 |
| 2005/0232818 A1 * | 10/2005 | Sandell | G01N 35/028 422/400 |
| 2008/0156635 A1 * | 7/2008 | Simon | H01L 21/67098 204/192.1 |

(Continued)

*Primary Examiner* — Nitin Parekh
(74) *Attorney, Agent, or Firm* — Schwabe, Williamson & Wyatt, P.C.

(57) ABSTRACT

An integrated circuit package that includes a liquid phase thermal interface material (TIM) is described. The package may include any number of die. The liquid phase TIM can be sealed in a chamber between a die and an integrated heat spreader and bounded on the sides by a perimeter layer. The liquid phase TIM can be fixed in place or circulated, depending on application. A thermal conductivity of the liquid phase TIM can be at least 15 Watts/meter-Kelvin, according to some embodiments. A liquid phase TIM eliminates failure mechanisms present in solid phase TIMs, such as cracking due to warpage and uncontained flow out of the module.

20 Claims, 4 Drawing Sheets

(56) References Cited

U.S. PATENT DOCUMENTS

| | | | |
|---|---|---|---|
| 2009/0096747 A1* | 4/2009 | Chou | G06F 3/0362 |
| | | | 345/156 |
| 2009/0152713 A1* | 6/2009 | Sauciuc | H01L 23/3737 |
| | | | 257/E23.101 |
| 2010/0096747 A1* | 4/2010 | Kusano | H01L 23/49822 |
| | | | 257/E23.101 |
| 2019/0055626 A1* | 2/2019 | Liu | H01L 23/3736 |

* cited by examiner

FIG. 1
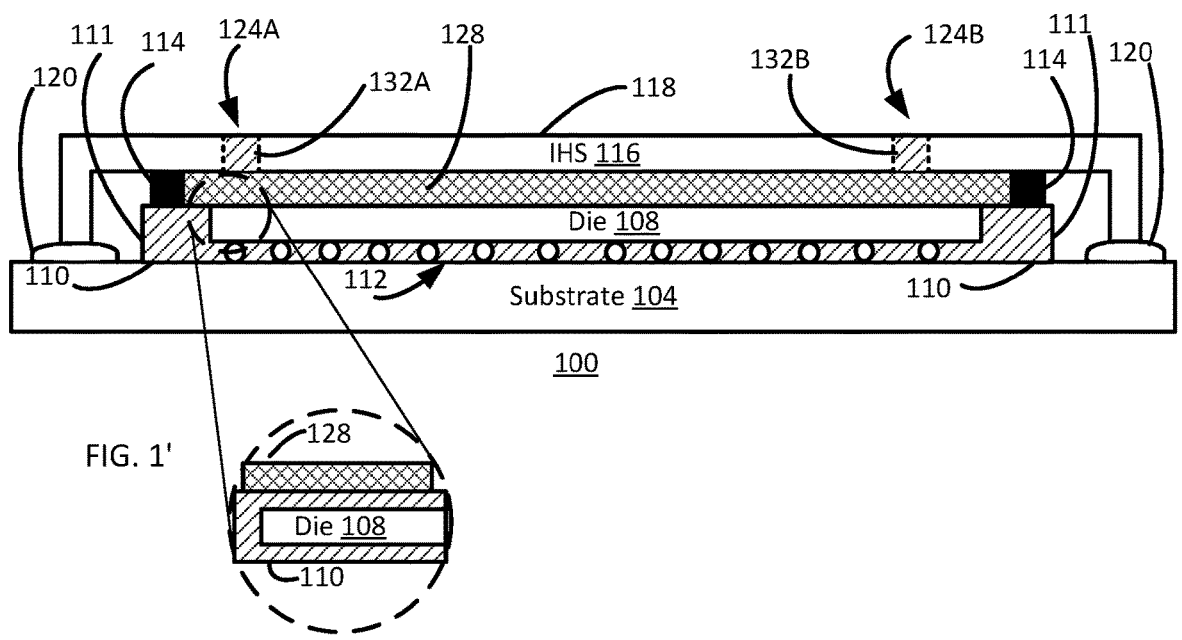
FIG. 1'
FIG. 2
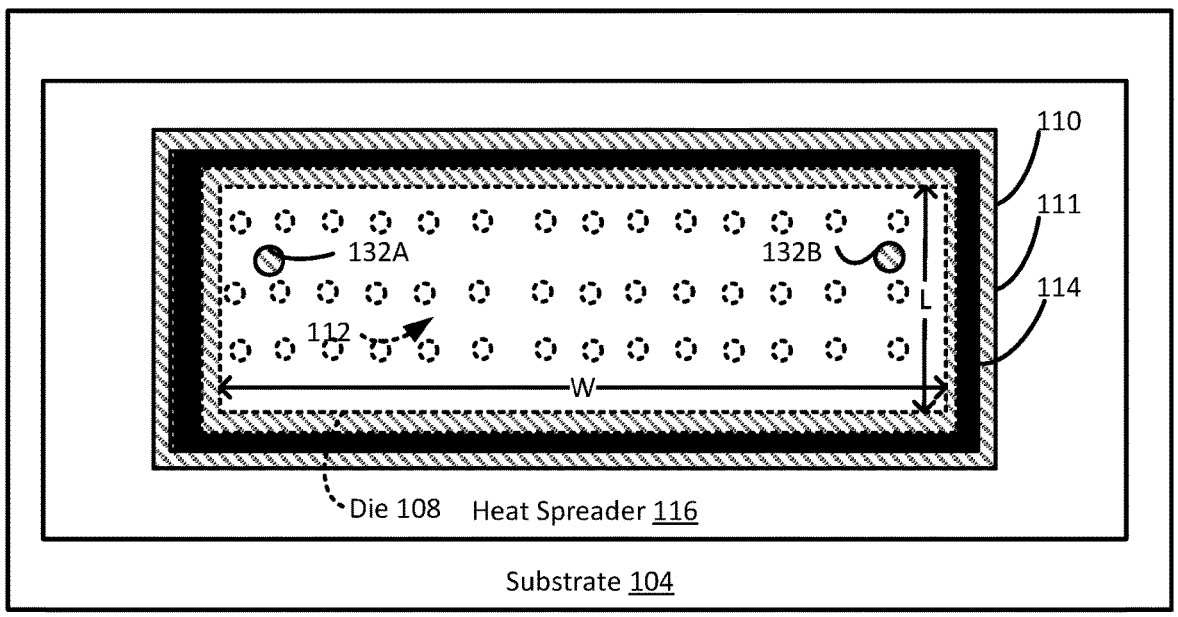

LIQUID THERMAL INTERFACE MATERIAL IN ELECTRONIC PACKAGING

BACKGROUND

Integrated circuitry continues to scale to smaller feature dimensions and higher packaging densities. With such scaling, the density of power consumption of a given microelectronic device within a given package tends to increase, which, in turn, tends to increase the average junction temperature of transistors of that device. If the temperature of the microelectronic device becomes too high, the integrated circuits in the device may be damaged or otherwise suffer performance issues (e.g., sub-optimal performance such as low gain or slow switching speeds, or catastrophic failure where one or more portions of the integrated circuitry is destroyed). This issue is exacerbated when multiple microelectronic devices are incorporated in close proximity to one another in a given die layout. Thus, thermal transfer solutions, such as integrated heat spreaders, must be utilized to remove heat from such microelectronic devices. There are a number of non-trivial and unresolved issues associated with thermal management.

BRIEF DESCRIPTION OF THE DRAWINGS

FIG. 1 is a cross-sectional view of a module that includes a liquid phase thermal interface material (TIM), in accordance with an embodiment of the present disclosure.

FIG. 1' is a cross-sectional view of a variation of the module depicted in FIG. 1, in which a polymer layer is disposed around and on a second surface of the die, in accordance with an embodiment of the present disclosure.

FIG. 2 is a plan view of a module that includes a liquid phase thermal interface material (TIM), in accordance with an embodiment of the present disclosure.

Figure 3A:
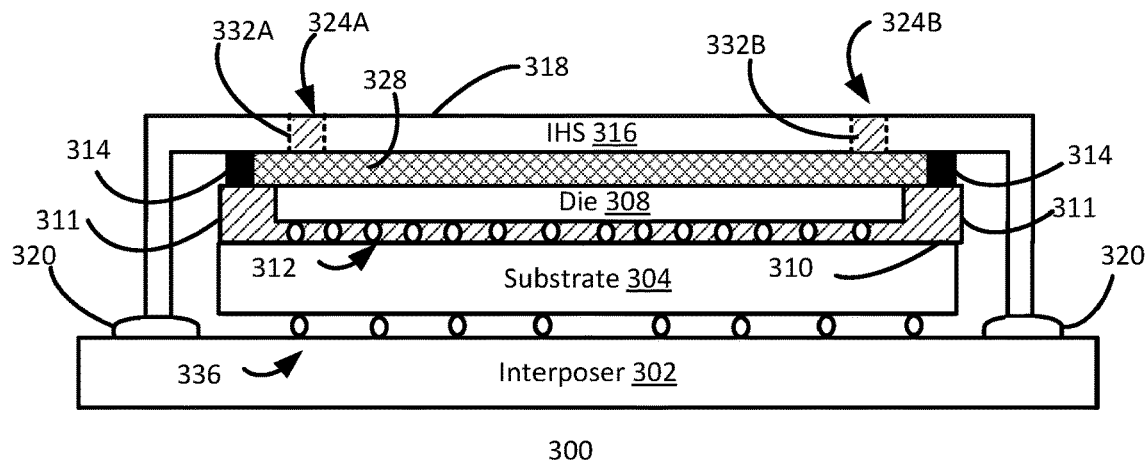
FIGS. 3A and 3B are cross-sectional views of alternative configurations of modules that include a liquid thermal interface material (TIM), in accordance with embodiments of the present disclosure.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming an electronic component package (a "module" for brevity) that includes a liquid phase thermal interface material (TIM). Modules described herein also include a thermally conductive integrated heat spreader ("IHS"), according to some embodiments. The IHS includes a top plate and walls that define a chamber above one or more integrated circuit chips (one or more "die"). Holes, whether pre-existing in the top plate or formed in the top plate after attachment of the IHS to a package substrate or interposer, can be used to provide a liquid TIM to the chamber. After providing the liquid TIM to the chamber, the holes can then be filled with an epoxy or other suitable sealant to seal the liquid TIM within the chamber or alternatively connected to a system that circulates liquid TIM through the chamber to further improve removal of waste heat. Any number of integrated circuit packaging configurations (e.g., multi-chip, single chip, vertical stack, etc) can benefit from the disclosed techniques, as will be appreciated in light of this disclosure. Any such packages may be generally referred to herein as an integrated circuit package or microelectronics package or simply a module.

General Overview

An integrated circuit package, or module, can include a packaging substrate, one or more die, and interconnections between the die and the packaging substrate (referred to herein as "first level" interconnections). A mechanically durable polymer (e.g., an epoxy, a thermosetting polymer), sometimes referred to as a "mold" material is sometimes flowed between the die and substrate, between the individual first level interconnections therebetween, and in some cases up to and/or over a second (top or upper) surface of the die opposite the first level interconnections. The second surface of the die can then optionally be coated with a conductive material that improves thermal conduction of waste heat out of the die. This "thermal interface material" can be, for instance, a layer of a polymer matrix filled with thermally conductive particles or a solid phase of a metal (e.g., indium, or other suitably conductive metal).

A number of non-trivial and unresolved issues are associated with thermal management solutions for integrated circuitry, particularly with respect to integrated circuit packages that include multiple die, one or more of which requires very high-power. For instance, consider a semiconductor package that includes a die mounted on a substrate (e.g., central processing unit and graphics processing unit, or CPU and GPU) and optionally one or more additional die (e.g., one more additional processors, a memory die such as high bandwidth memory, or HBM), along with an integrated heat spreader that covers the processor (and any other die in a multi-chip package). In such cases, even a single processor may consume very high-power (e.g., on the order of hundreds of Watts). Heat generated from the consumption of power can be removed from the package using an integrated heat spreader (IHS) that is in contact with the die. While direct contact between the IHS and the die is possible, it is possible to improve the rate of heat transfer across the interface between the IHS and die by placing a thermally conductive material at this interface. A polymer filled with thermally conductive particles or a film or sheet of conductive metal, termed a thermal interface material (TIM), can smooth the surface topography (e.g., micron-scale bumps and depressions) of the IHS and die. By coating the surface topography of these surfaces, a proportion of surface area through which heat transfer can occur is increased, thus increasing the rate at which heat is removed from the die. A heat sink with structures configured for radiating heat from the package to the atmosphere via convection or conduction may be attached to the IHS to further facilitate dissipation of heat.

However, as die size has decreased and the power consumption of die (in particular, processor chips) has increased, removal of excess heat has become more challenging. For example, temperature changes over time within a die (or within multiple die) on a substrate can cause physical warping of the die or other components of the module. This warping causes tensile and/or compressive stresses to be applied to the TIM. The stresses can lead to degradation of the TIM from cracking, or delamination between the TIM and the die and/or the IHS. This degradation in turn reduces the thermal conductivity of the TIM, which can lead to higher device temperatures. Elevated die temperature during processor operation can reduce the number of computational cycles per unit time that may be performed and can also increase the likelihood of a reliability failure of the processor.

Thus, integrated circuit packages or "modules" are disclosed herein which are configured to include a liquid phase thermal interface material. The liquid phase TIM can be sealed in a chamber, for example, between a die and an IHS that is bounded on the sides by a perimeter layer (e.g., additional mold material or other polymer). It will be appreciated that the phrase "liquid phase TIM" can include materials having any of a range of viscosities, from low viscosity materials (e.g., a viscosity~0.5 centiPoise) to high viscosity materials (e.g., a viscosity~1500 centiPoise) having a gel-like or gelatinous consistency that can nevertheless be moved through the chamber by negative and/or positive pressure. The liquid phase TIM has a number of advantages compared to solid phase TIMs (e.g., polymers filled with a thermally conductive material or conductive metal sheet/ film). For example, a liquid phase TIM reduces the contact resistance at the interface between the liquid phase TIM and die compared to a solid phase TIM, thus increasing the rate of heat removal from the die by the liquid phase TIM when compared to the solid phase TIM. This can be because the liquid phase TIM is better able to conform to the exposed surface of the die, including microscopic topographic features, as compared to a solid phase TIM. In another advantage, a thermal conductivity of liquid phase TIMs can be, for example, at least 15 Watts/meter-Kelvin. In some such example embodiments, this is as much as 10× greater than a thermal conductivity of a solid phase TIM. Another advantage is that using a liquid phase TIM eliminates failure mechanisms that degrade thermal conductivity present in solid phase TIMs, such as cracking, delamination, and warping. In some example embodiments, the high thermal conductivity of a liquid phase TIM can be due to the uniform composition of the liquid phase TIM, rather than a multi-phase mixture of solid phase materials used in some solid phase TIM compositions. Many variations will be apparent in light of this disclosure.

Architectures

FIG. 1 illustrates a cross-sectional view of a module 100 that includes a liquid phase TIM that has an improved thermal conductivity for the removal of waste heat generated from the operation of (in this example) a die or optionally multiple die in a multi-chip module. FIG. 2 is a plan view of the module 100 depicted in FIG. 1. Concurrent reference to FIGS. 1 and 2 may facilitate explanation.

The example module 100 includes a substrate 104, a die 108, interconnections 112, a mold layer 110 of polymer (or other suitable mold material), a perimeter layer 114 (sometimes referred to herein as a "second layer"), an integrated heat spreader (IHS) 116, and a liquid phase thermal interface material (TIM) 128.

The substrate 104 can include a number of integrated circuits thereon in the form of one or more die 108. The substrate 104 can be fabricated from a ceramic, a glass ceramic, a polymer, a semiconductor (e.g., silicon or gallium arsenide), and combinations thereof (e.g., a composite comprising a polymer matrix that includes layers or elements of silicon or another semiconductor material). Regardless of the substrate 104 material or structure, conductive contacts (e.g., "first level interconnections") can be disposed on a die-side surface of the substrate 104 and a surface of the substrate 104 opposite the die 108. These contacts can be used to electrically connect the die 108 to the substrate 104 using solder bumps or other connection technology (e.g., ball grid array or pins). Additional contacts disposed on a surface of the substrate 104 opposite the die 108 can electrically connect the substrate 104 to an interposer and/or a motherboard (not shown) via a variety of interconnection technologies (e.g., ball grid array, land grid array, pin grid array, etc.). Electrically conductive vias and traces can be disposed on various layers of the substrate 104, thus providing electrical connection between the die 108 and an interposer or motherboard.

The die 108, as described above, can include one or more integrated circuits fabricated on a semiconductor material. As shown in FIG. 1, the die 108 has a first surface that confronts a surface of the substrate 104. As described below, the die 108 is physically and electrically connected to the substrate 104 by first level interconnections 112 at locations corresponding to contacts (not shown). The second surface of the die 108 is opposite the first surface and is generally left exposed until introduction of the liquid TIM, as described below. In some examples, described below, the second surface of the die can be coated with a layer of the polymer 110. The die 108 also can be defined by its perimeter. Generally being a square or rectangle, the perimeter of the die 108 is defined by a length L of the die 108 and a width W of the die 108, both of which are shown in FIG. 2.

As referred to above, the first level interconnections 112 connect the die 108 to the substrate 104. Generally, interconnections 112 can be fabricated with a composition of solder. Solder balls of any configuration of interconnections 112 can be formed on one or both of the die 108 and the substrate 104 at appropriate locations (e.g. contact pads) so that when the die 108 and the substrate are placed together, the interconnections can be melted (reflowed), thus physically and electrically connecting the die 108 to the substrate 104.

A polymer layer 110, also referred to as a "mold" layer or "first layer" (shown in FIG. 1) is formed between the die and substrate, and between the individual interconnects of the array. The polymer layer 110 can be formed by, in some examples, placing and applying a compressive force to a low surface energy film on the second surface of the die 108. The low surface energy film can extend beyond the perimeter of the die 108. The polymer material can be applied to the die 108 until it fills the gaps between the first level interconnections and contacts the low surface energy film. In some examples, the produces a polymer layer 110 that is coplanar (or slightly higher) than the second surface of the die 108. In some examples the polymer layer 110 extends over a second surface of the die 108, thus forming an overmold. A portion of an overmolded die 108 is shown in FIG. 1'.

Any number of commercially available or proprietary mold materials can be used, which are sometimes called molding compounds or semiconductor mold compounds. Typical mold compounds include, for instance, epoxy resins, hardeners, and catalysts. A mold compound can be selected for a given application based on its properties, such as the glass transition temperature, thermal conductivity, coefficient of thermal expansion, flexural modulus, adhesion properties, and/or moisture absorption rate. Any excess material of the polymer layer 110 (e.g., that may become disposed on a top surface of the die 108 and reduce the rate of heat removal from the die 108) can be removed by grinding or some other suitable process, so as to expose the top surface of die 108. In situations in which an "overmold" configuration is desired the layer of overmold can be planarized so as to be level and/or ground to a desired thickness (e.g., a few microns) over the second surface of the die 108.

The polymer layer 110 includes exposed portions 111 that extend beyond the perimeter of the die 108. In some examples, the exposed portions 111 are from 100 microns to 1 or 2 millimeters beyond the perimeter of the die 108. In other examples, the exposed portions extend within any of the following ranges from one or more sides of the die 108: from 100 microns to 200 microns; from 200 microns to 1 mm; from 200 microns to 500 microns; from 500 microns to 750 microns.

In some examples, the exposed portions 111 can be coplanar with the second surface of the die 108, although it will be appreciated that this need not be the case given that a liquid phase TIM 128 will naturally fill a chamber of any shape. The exposed portions 111 generally have a planar surface, which facilitates formation of the perimeter layer 114 as described below. The exposed portions 111 can be ground, planarized and or leveled to facilitate a seal (that will not leak) with the perimeter layer 114 described below. In some examples, an intervening polymer (e.g., thermoset polymer or epoxy) or adhesive can be placed on the exposed portions 111 and between the exposed portions and the perimeter layer to encourage a uniform interface that provides a liquid-tight seal.

The perimeter layer 114 is disposed above the exposed portions 111 of the polymer layer 110 (in whole or in part) and in some cases, in direct contact or in indirect contact (e.g., via an adhesive or sealing polymer) with the exposed portions 111 of the polymer layer 110. The perimeter layer 114 in some examples is formed from the same material as the polymer layer 110, namely mold compounds that can include epoxy resins, hardeners, and catalysts. As with the exposed portions 111, the perimeter layer 114 can be ground flat, planarized, leveled, or otherwise modified to encourage a tight seal with both the underlying exposed portions 111 and, ultimately, an overlying IHS 116. The perimeter layer 114 will ultimately form a boundary of a chamber in which a liquid phase TIM can be disposed.

The IHS 116, and more specifically a top plate 118 of the IHS 116, can be placed in contact with the perimeter layer 114. This contact, as illustrated in FIG. 1, forms a chamber defined by the top plate 118 and the perimeter layer 114. In this example module 100, the IHS 116 is also placed in contact with, and connected to, the substrate 104 using sealant 120. In examples a top plate 118 of the IHS 116 can be at least 10 µm over the exposed surface of the die, thus defining a height of the chamber. In other examples, a height of the chamber can be within any of the following ranges: from 10 µm to 20 µm; 20 µm to 50 µm; from 50 µm to 100 µm; from 100 µm to 250 µm; from 250 µm to 1000 µm.

Examples of the IHS include materials having a high thermal conductivity including but not limited to, copper. While copper is used in some examples herein due to its relatively high thermal conductivity, note that other materials can also be used. For instance, according to other embodiments, the metal features can be made of, for example, aluminum, beryllium, gold, silver, or other metals having a relatively high thermal conductivity, such as metals having a thermal conductivity in excess of 200 Watts per meter-Kelvin (W/m-K), or in excess of 300 W/m-K, or higher. In a more general sense, any metal can be used as long as it has a thermal conductivity that is suitable for conducting heat from the die 108. Furthermore, any of the preceding IHS materials can be formed with an additional, high thermal conductivity material (e.g., as a filler, as strips, or other configuration) to form a composite IHS. Example additional materials that can improve the thermal conductivity of a composite IHS (relative to a non-composite IHS) can include graphite, diamond, and high thermal conductivity ceramics (e.g., boron nitride). In some other examples, an IHS can also be fabricated to include chambers or channels through which a fluid (e.g., a vapor, gas, or liquid) can be flowed so as to conduct heat from the IHS.

Examples of the sealant 120 used to connect the IHS 116 to the substrate 104 include but are not limited to the materials used for the polymer layer 110.

In some examples, holes 124A, 124B can be formed (e.g., via chemical etching, mechanical drilling, laser drilling) within the top plate 118 of the IHS 116. It is through these holes 124A, 124B that a liquid phase TIM 128 can be introduced into the chamber defined by the top plate 118 of the IHS 116 and the perimeter layer 114. As shown in FIGS. 1 and 2, after providing the liquid phase TIM 128 to the chamber, the holes 124A, 124B can be filled with plugs 132A, 132B. The plugs 132A, 132B, which can be formed from any of the materials used for the polymer layer 110, thus seal the liquid phase TIM 128 within the chamber between the die 108, the IHS 116, and the perimeter layer 114. In other examples, the plugs 132A, 132B can be formed from a solder, such as a leadfree solder or other eutectic/eutectic solders. Solders can be removed by localized reheating so that the liquid phase TIM 128 can be refilled, removed, and/or replaced.

Examples of the liquid phase TIM 128 include but are not limited to metal alloys having a eutectic transition temperature below 20° C. or below 15° C. In some examples of the liquid phase TIM 128 has a thermal conductivity of at least 15 Watts/meter-Kelvin. In one example, a liquid phase TIM 128 can be a eutectic alloy comprising on or more of bismuth (Bi), lead (Pb), tin (Sn), cadmium (Cd), antimony (Sb), indium (In), thallium (Tl), tellurium (Te), selenium (Se), gallium (Ga), and/or mercury (Hg).

Depending on the composition and the eutectic temperature of the liquid phase TIM 128 relative to the temperature at which the electronic package is fabricated, the liquid phase TIM 128 can be placed on the second surface of the die 108 in a solid phase. Upon heating of the liquid phase TIM 128 by the die 108, the eutectic temperature of the liquid phase TIM 128 can be exceeded, thus causing the phase transformation to liquid.

In one specific example, the liquid phase TIM 128 is the alloy "Galinstan," which is comprised of gallium, indium, and tin. One embodiment of Galinstan is a eutectic alloy that is from 62 weight (wt.)% to 95 wt. % gallium, 5 wt. % to 22 wt. % indium, and 0 wt. % to 16 wt. % tin, with the sum of weight percentages totaling 100 wt. %. Galinstan can have a eutectic temperature (melting from solid to pure liquid) of from 11° C. to −19° C. and can have a thermal conductivity of at least 16 W/m-K.

Figure 3B:
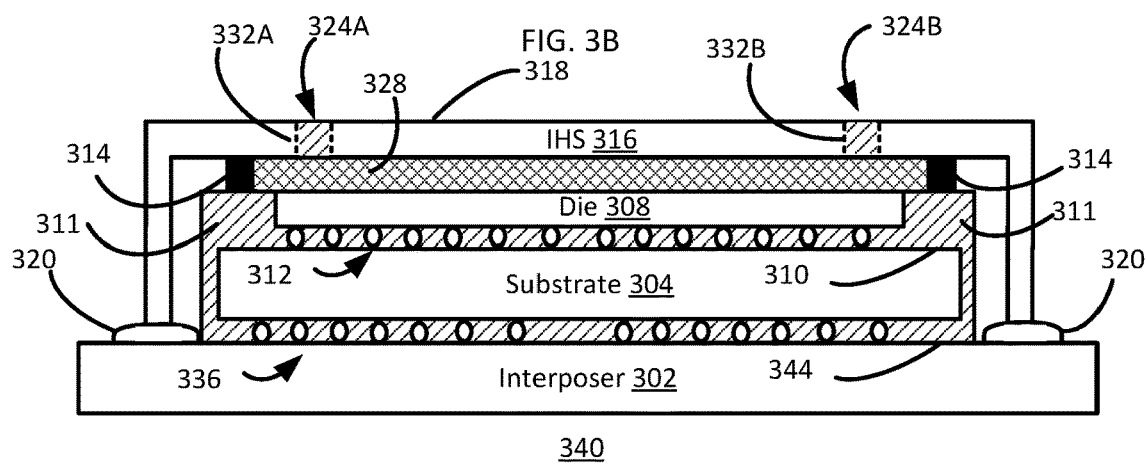
Figure 4:
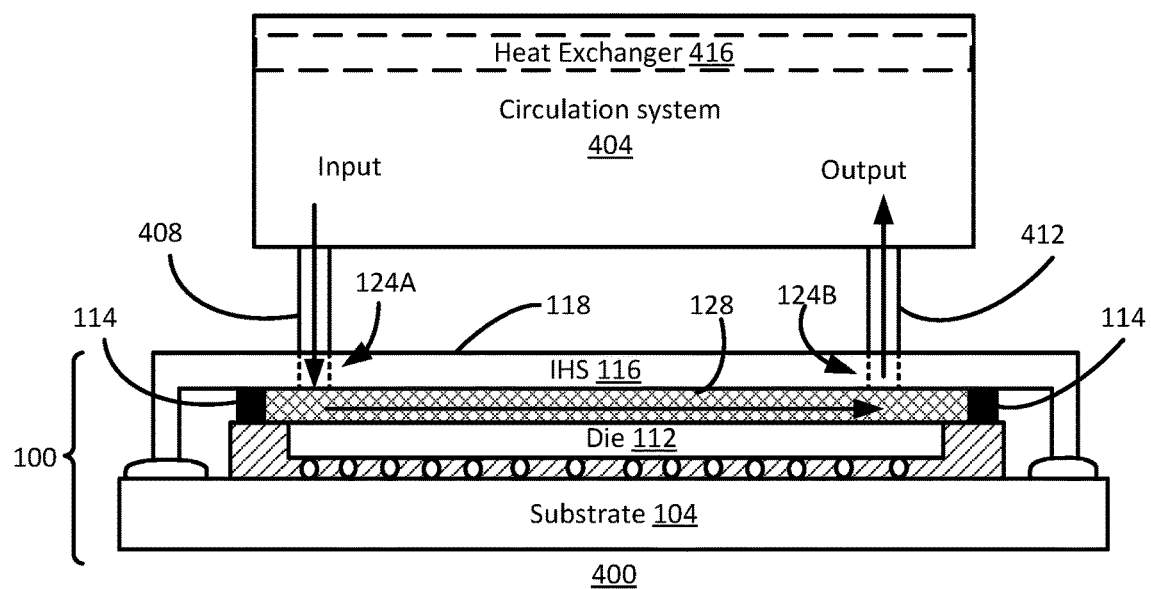
FIG. 4 is a cross-sectional view of a module that includes a liquid phase thermal interface material (TIM) circulated through a module chamber by a circulatory system, in accordance with an embodiment of the present disclosure.

Alternative architectures of modules that include a liquid phase TIM are illustrated in FIGS. 3A, 3B, and 4. Turning first to FIG. 3A, a cross-sectional view of an example module 300 is depicted. Analogous to the example module 100, the example module 300 includes a substrate 304, a die 308, interconnections 312, in a polymer layer 310, and a liquid thermal interface material (TIM) 328. Features in FIG. 3A analogous to those provided in the context of FIG. 1 need no further description. Unlike the example module 100 depicted in FIG. 1, the die 308 and substrate 304 of the example module 300 are mounted on an interposer 302. The interposer 302 is analogous to the substrate 304 in its construction. That is, example interposers 302 can be fabricated from one or more layers of ceramics, glass ceramics, or polymers (e.g., FR4) in which are fabricated various conductive traces and vias to form electrically conductive pathways. Generally, the interposer 302 can be used to transition a pitch of interconnections 312 between the die 308 and a substrate 304 to a larger pitch, such as a pitch between the interposer 302 and a motherboard (not shown). In some examples, the interposer 302 can be used to reduce stresses and strains applied to the substrate 304 and/or the die 308 from thermal expansion and contraction from cyclical heating and cooling.

In this example, the interposer 302 and the substrate 304 are placed in mechanical and electrical connection via first level interconnections 336. As described above, the interconnections 336 can be fabricated from, in this example, solder. It will be appreciated that other interconnection technologies can be used as a substitute for those described here.

As is also shown in FIG. 3A, the IHS 316 is not mounted to the substrate 304, but rather to the interposer 302. Regardless of this difference, the top plate 318 of the IHS 316 still creates a chamber in conjunction with perimeter layer 314, as described above. Liquid phase TIM 328 is shown within this chamber, as are holes 324A, 324B that have been filled with, in this example, a solder 332A, 332B after provision of the liquid phase TIM 328 to the chamber.

FIG. 3B illustrates an example module 340 that includes the same elements depicted and described in the context of FIG. 3A and FIG. 1. In addition to these previously described elements, the example module 340 includes a polymer layer 344 between the interposer 302 and the substrate 304.

Turning now to FIG. 4, an example system 400 is shown that includes the example module 100 and a circulation system 404 that circulates the liquid phase TIM through the chamber defined by top plate 118 of the IHS 116 and perimeter layer 114. The elements of the example system 400 include the example module 100, circulation system and reservoir 404, input conduit 408, and output conduit 412.

While some of the element numbers from FIG. 1 have been omitted for clarity, the IHS 116, top plate 118, and perimeter layer 114 are indicated with their responding reference numbers. Rather than sealing holes 124A, 124B with polymer or solder (as illustrated by shading in the preceding figures), these holes are connected to input conduit 408 and output conduit 412. The opposite ends of each of the input conduit 408 and output conduit 412 are placed in fluid communication with the circulation system 404. In this way, heat generated by the die 108 can be continuously removed by a flow of liquid phase TIM 128. The liquid phase TIM 128 can be pumped from the circulation system 404 through the input conduit 408 and drawn from the chamber after removing heat from the die 108 by a negative pressure applied to the output conduit 412. To facilitate this movement of liquid phase TIM 128 through the chamber, the circulation system 404 may include a pump (e.g. a peristaltic pump, a mass flow controller, or other similar device) and a reservoir for containing liquid phase TIM 128. Furthermore, the circulation system 404 may include a heat exchanger 416 that removes heat from liquid phase TIM 128 that has passed through the chamber within the module 100.

Methodology

Figure 5:
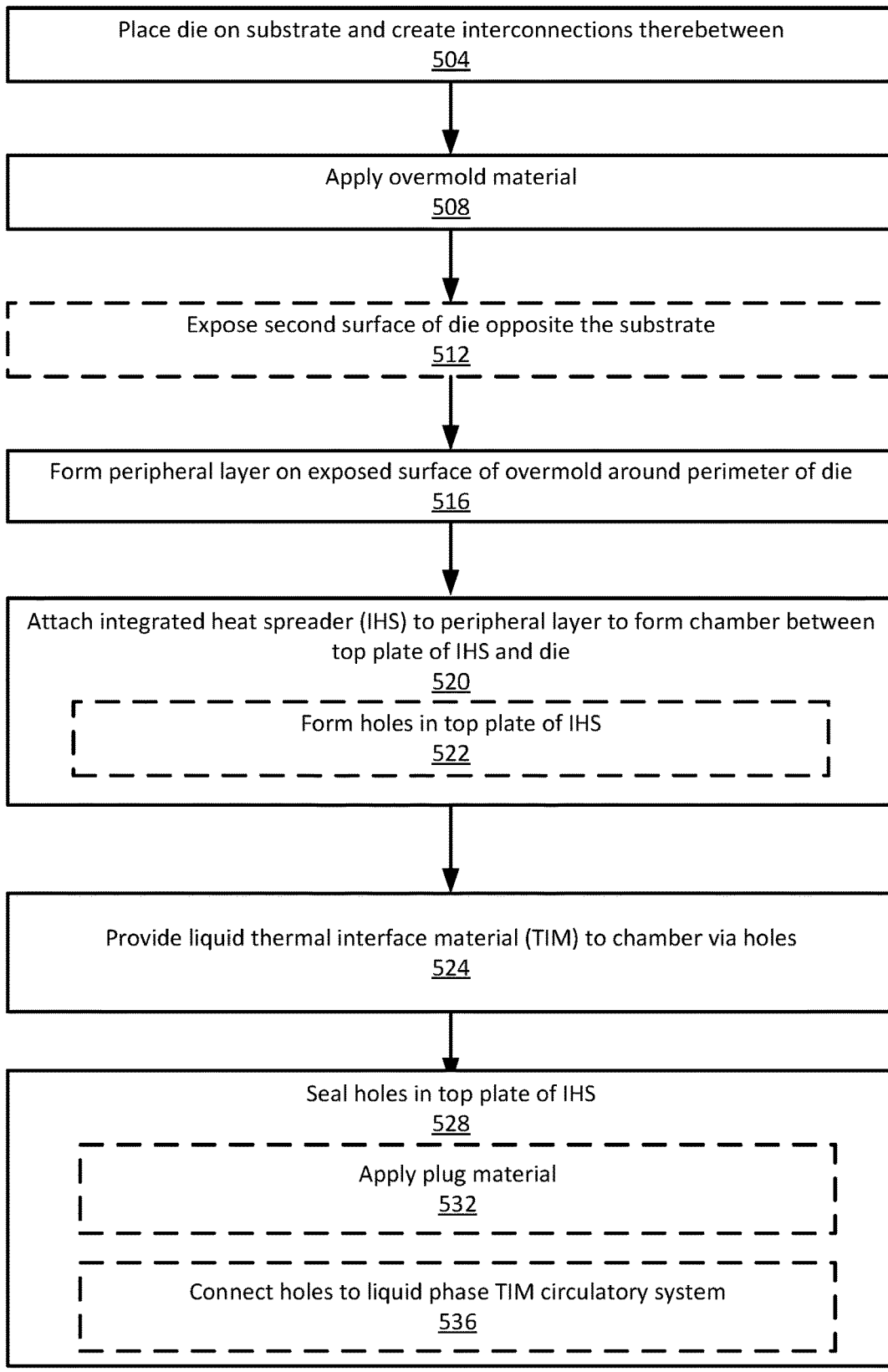
FIG. 5 is a method flow diagram of an example method for fabricating a module that includes a chamber filled with a liquid thermal interface material (TIM), in accordance with an embodiment of the present disclosure.

FIG. 5 is a method flow diagram of an example method for fabricating a module that includes a chamber filled with a liquid thermal interface material (TIM), in accordance with an embodiment of the present disclosure. The method 500 can begin by placing 504 a die on a substrate and creating the interconnections therebetween (e.g., by causing solder-based interconnection material to melt or "reflow"). As described above, a first surface of the die confronts the substrate and is connected to the confronting surface of the substrate by the interconnections. A second surface of the die is opposite the first surface and the substrate. A polymer material is then applied 508 to the die and substrate. As described above, the polymer material can be an epoxy or a thermosetting polymer that, after application, is cured via heat and/or application of a curing agent.

A second surface of the die is optionally exposed 512 in the event that is was entirely or partially coating with polymer material. Exposing 512 the second surface can occur by grinding the polymer (when formed as an "overmold") from the surface, as well as scraping, chemical etching, or other subtractive manufacturing technique.

A perimeter layer can be formed 516 on portions of the polymer layer that extend beyond a perimeter of the die. This configuration is illustrated in FIGS. 1, 3A, 3B, and 4. In some embodiments it is possible to form 516 the perimeter layer on the second surface of the die itself. In some examples, this can reduce an amount of heat removed from the die by preventing contact between the liquid phase TIM and the second surface of the die.

An IHS is attached 520, at least in part, to an exposed surface of the perimeter layer. While the IHS may also be attached 520 to the substrate or an interposer, it is the attachment 520 of the IHS and the perimeter layer that forms the chamber into which liquid phase TIM can be disposed.

In some examples, one or more holes are formed 522 in a top plate of the IHS either before or after placement. In some examples, formation 522 of (at least) two holes enables the provision 524 of liquid phase TIM to the chamber and the escape of gas from the chamber displaced by the liquid phase TIM.

The hole(s) in the top plate of the IHS can be sealed 528. In one example, sealing 528 can occur by applying 532 a molten solder or an epoxy (or thermosetting polymer) to the holes so as to occlude or otherwise seal 528 them. In some examples, using a solder enables the holes to be opened again by melting the solder. This in turn can be used to periodically replace the liquid phase TIM to counteract the effects of thermal decomposition of the liquid phase TIM molecules.

Alternatively, the "sealing" can occur by connecting 536 the holes in the top plate of the IHS to a circulatory system, such as the one shown and described above in FIG. 4, via tubes or pipes. In this way, the liquid phase TIM can be circulated so that the liquid phase TIM heated by the die can be removed and replaced with cooler liquid phase TIM, thus maintaining a high rate of cooling. Furthermore, the removed liquid phase TIM can be cycled through a heat exchanger or chiller so that heat in the liquid phase TIM is removed prior to recirculating (i.e., re-providing 524) the liquid phase TIM to the chamber.

Example System

Figure 6:
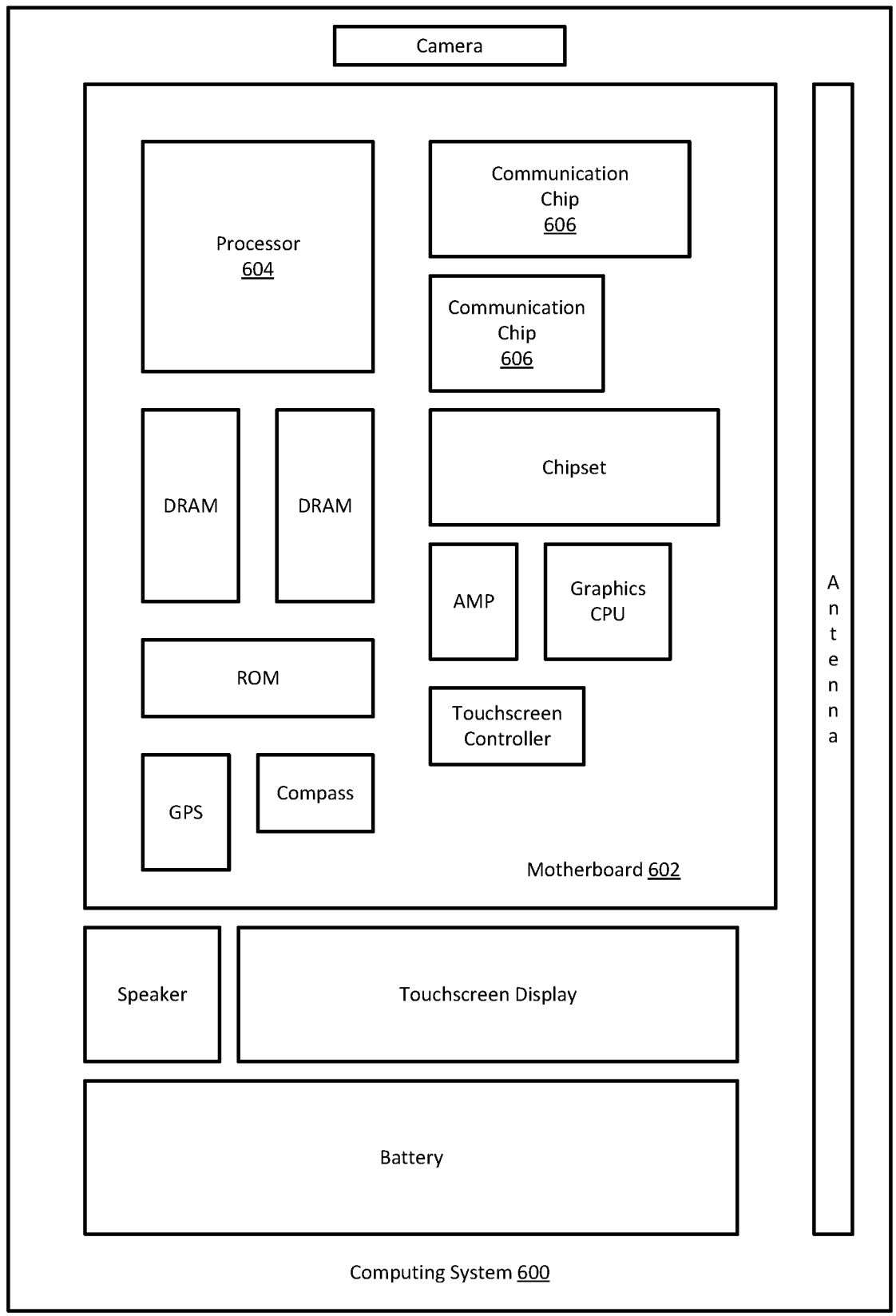
FIG. 6 illustrates a computing system implemented with integrated circuit structures and/or transistor devices formed using the techniques disclosed herein, in accordance with some embodiments of the present disclosure.

FIG. 6 is an example computing system implemented with one or more of the integrated circuit structures as disclosed herein, in accordance with some embodiments of the present disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board, whether a main board, a daughterboard mounted on a main board, or the only board of system 600, etc.

Depending on its applications, computing system 600 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., to include one or more modules that includes a liquid phase TIM between an exposed surface of a die and an integrated heat spreader, as variously provided herein). In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others. In some embodiments, communication chip 606 may include one or more transistor structures having a gate stack an access region polarization layer as variously described herein.

The processor 604 of the computing system 600 includes an integrated circuit die packaged within the processor 604. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit package comprising: a substrate; a die, comprising a first surface and a second surface opposite the first surface, the first surface facing a surface of the substrate, the die having a perimeter defined by a width and a length; a layer comprising polymer, the layer at least between the substrate and the die, the layer including a portion extending beyond the perimeter of the die; a heat spreader comprising a thermally conductive material, the heat spreader including a top plate, wherein the top plate and layer at least partly define a chamber above the second surface of the die; and a material comprising a liquid phase thermally conductive material within the chamber.

Example 2 includes the subject matter of Example 1, wherein the layer comprising polymer is a first layer, the integrated circuit package further comprising a second layer over the portion of the first layer and between the portion of the first layer and the heat spreader.

Example 3 includes the subject matter of Example 1 or 2, wherein the second layer comprises a polymer.

Example 4 includes the subject matter of Example 3, wherein the heat spreader is in thermal contact with the second layer.

Example 5 includes the subject matter of any of the preceding Examples, wherein the portion of the layer comprising polymer extends at least 100 microns beyond the perimeter of the die.

Example 6 includes the subject matter of any of the preceding Examples, wherein a top surface of the layer comprising polymer is coplanar with the second surface of the die.

Example 7 includes the subject matter of any of the preceding Examples, wherein the chamber has a height of at least 10 μm from the second surface of the die to an underside of the top plate of the heat spreader.

Example 8 includes the subject matter of any of the preceding Examples, wherein the heat spreader is in thermal contact with the die by way of a eutectic alloy comprising one or more of bismuth (Bi), lead (Pb), tin (Sn), cadmium (Cd), antimony (Sb), indium (In), thallium (Tl), tellurium (Te), selenium (Se), gallium (Ga), and/or mercury (Hg).

Example 9 includes the subject matter of any of the preceding Examples, wherein the eutectic alloy has a eutectic transition temperature of less than 20° C.

Example 10 includes the subject matter of any of the preceding Examples, wherein the heat spreader is in thermal contact with the die by way of a eutectic alloy comprising 62 weight (wt.) % to 95 wt. % gallium, 5 wt. % to 22 wt. % indium, and 0 wt. % to 16 wt. % indium, with the sum of weight percentages totaling 100 wt. %.

Example 11 includes the subject matter of any of the preceding Examples, wherein the eutectic alloy has a thermal conductivity of at least 16 Watts/meter-Kelvin and a eutectic transition temperature of less than 11° C.

Example 12 includes the subject matter of any of the preceding Examples, wherein the material comprising the liquid phase thermally conductive material has a thermal conductivity of at least 15 Watts/meter-Kelvin.

Example 13 includes the subject matter of any of the preceding Examples, further comprising a plurality of interconnections between the die and the substrate.

Example 14 includes the subject matter of any of the preceding Examples, wherein the top plate of the heat spreader defines a first hole and a second hole.

Example 15 includes the subject matter of Example 14, wherein one or both of the first hole and the second hole are filled with a polymer.

Example 16 includes the subject matter of Example 14, wherein the first hole and the second hole are filled with a solder.

Example 17 includes the subject matter of Example 14, further comprising a circulation system comprising a pump, an input conduit, and an output conduit, wherein the input conduit is connected to the first hole and the output conduit is connected to the second hole.

Example 18 includes the subject matter of Example 17, wherein the chamber has a height of at least 100 μm from the second surface of the die to an underside of the top plate of the heat spreader.

Example 19 includes the subject matter of any of the preceding examples, further comprising an interposer, wherein: the substrate is between the die and the interposer; and the heat spreader is connected to the interposer.

Example 20 is an integrated circuit package comprising: a substrate; a die, comprising a first surface and a second surface opposite the first surface, the first surface facing a surface of the substrate, the die having a perimeter defined by a width and a length; a layer comprising a polymer, the layer at least between the substrate and the die, the layer including a portion extending beyond the perimeter of the die wherein the layer comprising polymer is a first layer; a heat spreader comprising a thermally conductive material, the heat spreader including a top plate, wherein the top plate and layer at least partly define a chamber above the second surface of the die; and a second layer comprising a polymer over the portion of the first layer and between the portion of the first layer and the heat spreader.

Example 21 includes the subject matter of Example 20, further comprising a material comprising a liquid phase thermally conductive material within the chamber.

Example 22 includes the subject matter of either of Examples 20 or 21, wherein the liquid phase thermally conductive material is a eutectic alloy having a eutectic transition temperature of less than 20° C.

Example 23 includes the subject matter of any of Examples 20-22 wherein the heat spreader is in thermal contact with the second layer.

Example 24 includes the subject matter of wherein the chamber has a height of at least 10 μm from the second surface of the die to an underside of the top plate of the heat spreader.

Example 25 is an integrated circuit package comprising: a substrate; a die, comprising a first surface and a second surface opposite the first surface, the first surface facing a surface of the substrate, the die having a perimeter defined by a width and a length; a layer comprising polymer, the layer at least between the substrate and the die, the layer including a portion extending beyond the perimeter of the die; a heat spreader comprising a thermally conductive material, the heat spreader includes a top plate, wherein the top plate and layer at least partly define a chamber above the second surface of the die wherein the top plate of the heat spreader defines a first hole and a second hole; a material comprising a liquid phase thermally conductive material within the chamber; and a circulation system comprising a pump, an input conduit, and an output conduit, wherein the input conduit is connected to the first hole and the output conduit is connected to the second hole.

Example 26 includes the subject matter of Example 25, wherein the chamber has a height of at least 100 μm from the second surface of the die to an underside of the top plate of the heat spreader.

Example 27 includes the subject matter of either of Examples 25 or 26, further comprising a heat exchanger.

Example 28 is a motherboard comprising an integrated circuit package that includes the subject matter of any of the preceding Examples.

Example 29 is a computing device comprising an integrated circuit package that includes the subject matter of any of the preceding Examples.

What is claimed is:
1. An integrated circuit package comprising:
a substrate;
a die, comprising a first surface and a second surface opposite the first surface, the first surface facing a surface of the substrate, the die having a perimeter defined by a width and a length;
a layer comprising a polymer, the layer at least between the substrate and the die, the layer including a portion extending beyond the perimeter of the die and having a height up to at least the second surface of the die;
a heat spreader comprising a thermally conductive material, the heat spreader including a top plate, wherein the top plate and layer at least partly define a chamber above the second surface of the die;

a second layer comprising a polymer that forms side walls of the chamber, wherein the side walls are horizontally aligned at the portion of the layer; and a material comprising a liquid phase thermally conductive material within the chamber.

2. The integrated circuit package of claim 1, wherein the portion of the layer comprising polymer extends at least 100 microns beyond the perimeter of the die.

3. The integrated circuit package of claim 1, wherein a top surface of the layer comprising polymer is coplanar with the second surface of the die.

4. The integrated circuit package of claim 1, wherein the heat spreader is in thermal contact with the die by way of a eutectic alloy comprising one or more of bismuth (Bi), lead (Pb), tin (Sn), cadmium (Cd), antimony (Sb), indium (In), thallium (Tl), tellurium (Te), selenium (Se), gallium (Ga), and/or mercury (Hg).

5. The integrated circuit package of claim 1, wherein the heat spreader is in thermal contact with the die by way of an eutectic alloy comprising 62 weight (wt.) % to 95 wt. % gallium, 5 wt. % to 22 wt. % indium, and 0 wt. % to 16 wt. % tin, with a sum of weight percentages totaling 100 wt. %.

6. The integrated circuit package of claim 5, wherein the eutectic alloy has a thermal conductivity of at least 16 Watts/meter-Kelvin and a eutectic transition temperature of less than 11° C.

7. The integrated circuit package of claim 1, wherein the material comprising the liquid phase thermally conductive material has a thermal conductivity of at least 15 Watts/meter-Kelvin.

8. The integrated circuit package of claim 1, wherein the top plate of the heat spreader defines a first hole and a second hole.

9. The integrated circuit package of claim 8, wherein one or both of the first hole and the second hole are filled with a polymer.

10. The integrated circuit package of claim 8, wherein the first hole and the second hole are filled with a solder.

11. A motherboard comprising the integrated circuit package of claim 1.

12. A computing device comprising the integrated circuit package of claim 1.

13. An integrated circuit package comprising:
a substrate;
a die, comprising a first surface and a second surface opposite the first surface, the first surface facing a surface of the substrate, the die having a perimeter defined by a width and a length;
a layer comprising a polymer, the layer at least between the substrate and the die, the layer including a portion extending beyond the perimeter of the die wherein the layer comprising polymer is a first layer and the portion extends vertically up to at least the second surface of the die;
a heat spreader comprising a thermally conductive material, the heat spreader including a top plate, wherein the top plate and layer at least partly define a chamber above the second surface of the die; and
a second layer comprising a polymer over the portion of the first layer and between the portion of the first layer and the heat spreader to form side walls of the chamber, wherein an entirety of the second layer is above the second surface of the die.

14. The integrated circuit package of claim 13, further comprising a material comprising a liquid phase thermally conductive material within the chamber.

15. The integrated circuit package of claim 14, wherein the liquid phase thermally conductive material is a eutectic alloy having a eutectic transition temperature of less than 20° C.

16. The integrated circuit package of claim 13, wherein the heat spreader is in thermal contact with the second layer.

17. The integrated circuit package of claim 13, wherein the chamber has a height of at least 10 μm from the second surface of the die to an underside of the top plate of the heat spreader.

18. An integrated circuit package comprising:
a substrate; a die, comprising a first surface and a second surface opposite the first surface, the first surface facing a surface of the substrate, the die having a perimeter defined by a width and a length;
a layer comprising a polymer, the layer at least between the substrate and the die, the layer including a portion extending beyond the perimeter of the die;
a heat spreader comprising a thermally conductive material, the heat spreader including a top plate, wherein the top plate and layer at least partly define a chamber above the second surface of the die wherein the top plate of the heat spreader defines a first hole and a second hole; a material comprising a liquid phase thermally conductive material within the chamber; and
a circulation system comprising a pump, an input conduit, and an output conduit, wherein the input conduit is connected to the first hole and the output conduit is connected to the second hole, wherein the circulation system is configured to pump the liquid phase thermally conductive material through the chamber from the first hole to the second hole.

19. The integrated circuit package of claim 18, wherein the chamber has a height of at least 100 μm from the second surface of the die to an underside of the top plate of the heat spreader.

20. The integrated circuit package of claim 18, further comprising a heat exchanger.

* * * * *